Dec. 12, 1961 D. R. GREENBERG 3,013,164

LINEAR SAW-TOOTH GENERATOR

Filed May 5, 1959

INVENTOR.
DAVID R. GREENBERG
BY Wade Koontz
George Fine
ATTORNEYS

United States Patent Office 3,013,164
Patented Dec. 12, 1961

3,013,164

LINEAR SAW-TOOTH GENERATOR

David R. Greenberg, Bellerose, N.Y., assignor to the United States of America as represented by the Secretary of the Air Force Filed May 5, 1959, Ser. No. 811,240
3 Claims. (Cl. 307—88.5)

This invention relates to a saw-tooth generator and more particularly to a linear saw-tooth generator utilizing semi-conductor devices.

Saw-tooth generators are utilized in many areas. The most important of these are as sweep voltages of cathode-ray oscillographs, and for the deflection of the electron beam in television picture tubes. Other important uses include radar systems, the saw-tooth generator therein forming the basis of nearly all range-sweep circuits and of many range-measuring circuits as well. The aforementioned utilizations of the saw-tooth generator require that the generated saw-tooth be linear, particularly the control portion of the wave.

In the previous art, a thyratron saw-tooth-wave generator has been widely employed, however, the degree of linearity available therefrom is not adequate. Three circuits with improvements in their linearity characteristics have been utilized in the past; namely, the constant current capacitor charging by use of a pentode; the bootstrap circuits; and the saw-tooth-wave generator based on the Miller integrator.

Other desirable characteristics in a saw-tooth wave, in addition to linearity, are a fly back time that is a reasonably small fraction of the time of one cycle, uniformity of the waveform from cycle to cycle, and ability to synchronize with other waveforms. To achieve these characteristics a novel saw-tooth waveform generator is provided which utilizes semi-conductor devices exclusively.

In accordance with the present invention an astable point-contact transistor multivibrator is utilized. Upon application of a pulse to the multivibrator, its transistor moves from the cutoff region, through the saturation region and back into the cutoff region again (astable operation). During the time the multivibrator transistor is in its saturation region, a capacitor receives a charge through a diode from the emitter of the multivibrator point-contact transistor. The diode prevents the capacitor from attempting to discharge through the emitter circuit of the multivibrator point-contact transistor. One of the unique features of the present invention is the employment of a junction transistor as a constant current discharge path for the charging capacitor. This capacitor discharges at a constant rate through the collector circuit of a junction transistor. An important feature of the present invention is the utilization of a junction transistor as the emitter resistance of the multivibrator point-contact transistor.

An object of the present invention is to provide a novel saw-tooth waveform generator utilizing an astable multivibrator employing semi-conductor devices.

Another object of the present invention is to provide a novel saw-tooth waveform generator utilizing an astable multivibrator employing semi-conductor devices.

Still another object of the present invention is to provide a novel saw-tooth waveform generator utilizing an astable semi-conductor multivibrator which employs a transistor whose emitter resistance is supplied by a second transistor and further provides a constant discharge path for a storage capacitor.

A further object of the present invention is to provide a novel saw-tooth generator whose output waveform is highly stable and linear.

Other desirable objects and features of the invention, and the manner in which they are realized, will be apparent from the following detailed description of one embodiment of the invention, when considered in connection with the drawings, in which.

Figure 1:
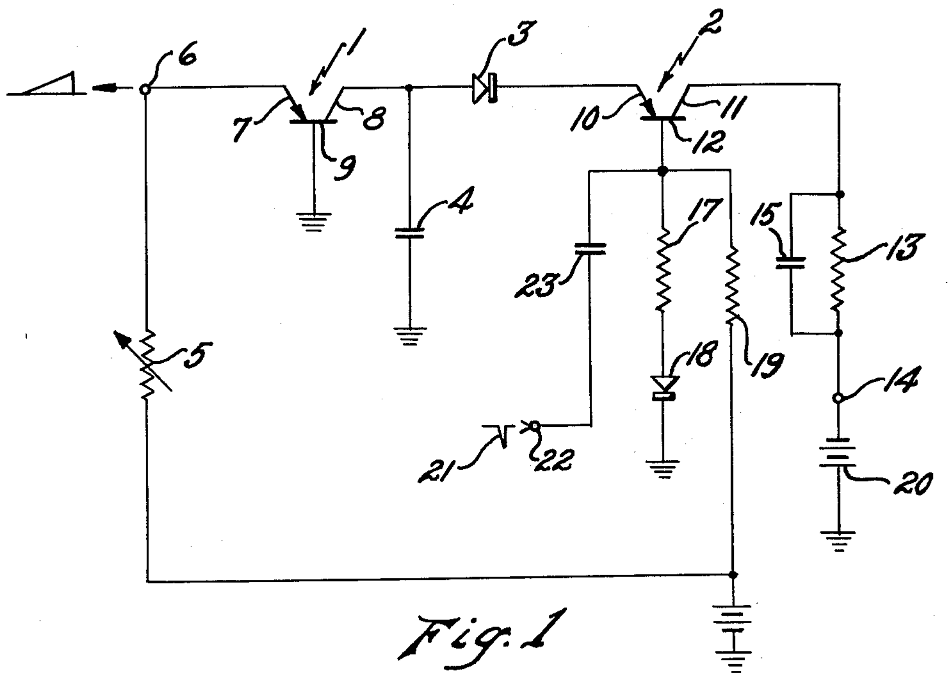
FIG. 1 is a schematic diagram of the saw-tooth generator.

Referring now to FIG. 1, there is shown a semiconductive device which is point-contact transistor 2. Transistor 2 is comprised of a block of semi-conductive material and with which are associated three electrodes consisting of emitter 10, collector 11 and base 12. Emitter electrode 10 is connected through diode 3 to collector electrode 8 of PNP junction transistor 1. Collector electrode 11 is connected through resistance 13 to negative terminal 14 of a direct current bias potential which is shown as battery 16, whose positive side is connected to ground. Resistor 13 is connected in shunt with capacitor 15. Base electrode 12 is connected through resistor 17 and diode 18 to ground. Base electrode 12 is also connected through resistor 19 to the positive side of battery 20 which serves as a direct current bias potential source. Battery 20 has its negative side connected to ground. Terminal 22 receives a trigger pulse 21 which is fed to base electrode 12 by way of capacitor 23.

Transistor 1 is of the PNP junction type, and with which are associated three electrodes consisting of emitter 7, collector 8 and base 9. Collector electrode 8 is simultaneously connected to ground by way of capacitor 4 and to transistor 2 by way of diode 3. Base electrode 9 is connected directly to ground. Emitter electrode 7 is connected through variable resistor 5 to the positive side of battery 20 which serves as a direct current bias potential source. The negative side of battery 20 is connected to ground. Terminal 6 serves as the output for the saw-tooth generator.

Figure 2:
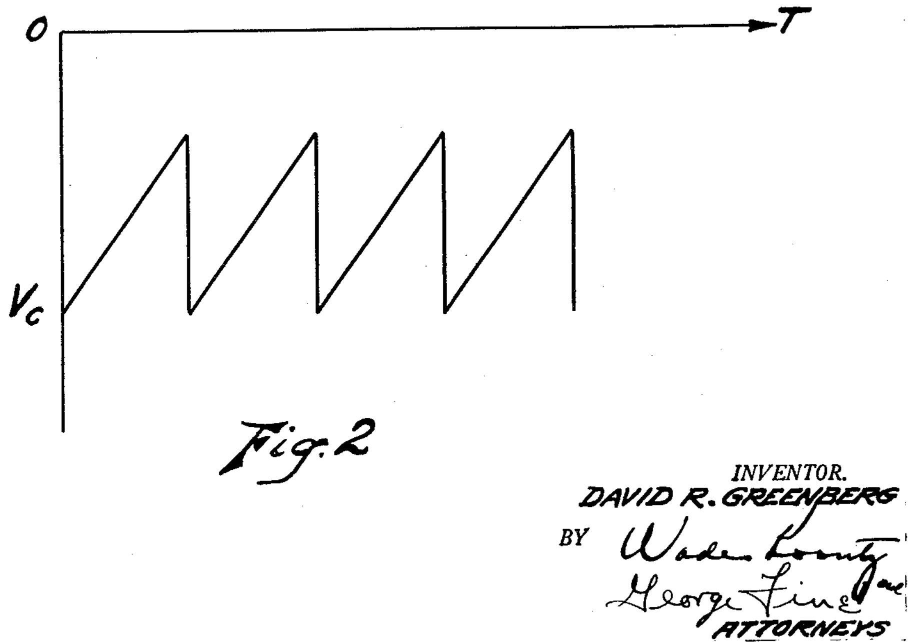
FIG. 2 shows the output waveform of the saw-tooth generator.

The transistor saw-tooth generator herein disclosed basically is comprised of an astable point-contact transistor 2 multivibrator with PNP junction transistor 1. Transistor 1 is utilized as the emitter resistance for point-contact transistor 2. Upon the application of negative trigger pulse 21 to terminal 22, transistor 2 will move from the cutoff regions, through the saturation region and back into the cutoff region (astable operation). During the time transistor 2 is in its saturation region, capacitor 4 receives a negative charge through diode 3, from emitter electrode 10 of transistor 2. Diode 3 prevents capacitor 4 from attempting to discharge through the emitter circuit of transistor 2. One of the unique features of the present invention resides in the utilization of junction transistor 1 as a constant current discharge path for capacitor 4. Capacitor 4 will discharge at a constant rate through the collector circuit of transistor 1. The discharge rate may be controlled by variation of the emitter current of transistor 1. This is accomplished by varying resistor 5. The output waveform at terminal 6 consists of a positive going saw-tooth waveform as shown in FIG. 2.

For the presently disclosed embodiment of this invention this saw-tooth is kc. However, it should be understood that the basic logic of the present invention will hold for other frequencies.

Although in accordance with the provisions of the patent statutes this invention is described and embodied in concrete form and the principle thereof has been described, together with the best mode in which it is now contemplated applying that principle, it will be understood that the apparatus shown and described is merely illustrative, and that the invention is not limited thereto, since alterations and modifications will readily suggest themselves to persons skilled in the art without departing from the true spirit of this invention or from the scope of the annexed claims.

What is claimed is:

1. A saw-tooth generator comprising an astable multivibrator, said multivibrator including a point-contact transistor having emitter, collector and base electrodes, said collector electrode being connected to a voltage source by way of a resistor, said base electrode being connected to ground by way of a resistor and a first diode, said base also being adapted to receive an actuating signal by way of a capacitor, a junction transistor operating as the emitter resistance of said point-contact transistor, said junction transistor having emitter, collector and base electrodes, said emitter electrode of said junction transistor being connected to a voltage source by way of a variable resistor, said base electrode of said junction transistor being connected directly to ground, and said collector electrode of said junction transistor being connected by way of a second diode to said emitter electrode of said point-contact transistor, said collector electrode of said junction transistor also being connected to ground by way of a storage capacitor, means to actuate said astable multivibrator, and means to discharge said storage capacitor by way of said junction transistor when said multivibrator reaches cutoff after said actuation operation.

2. A saw-tooth waveform generator comprising an astable multivibrator including a first transistor having emitter, collector, and base electrodes, said multivibrator being normally inoperative, means to trigger said multivibrator into operation, said first transistor upon said triggering going automatically from nonconduction into saturation and back to nonconduction, a second transistor having emitter, collector and base electrodes, said base electrode of said second transistor being connected to ground, said emitter of said second transistor serving as an output terminal for said saw-tooth waveform and also being connected to a voltage source by way of a variable resistor, said collector of said second transistor being connected to ground by way of a capacitor, unilateral means connecting said emitter of said first transistor to said collector of said second transistor, said unilateral means conducting current exclusively during said operative periods of said multivibrator thus charging said capactitor, and means to discharge the current from said capacitor exclusively by way of said second transistor after said multivibrator returns to the inoperative state, said discharge current thus providing a saw-tooth waveform at said emitter of said second transistor.

3. A saw-tooth waveform generator comprising an astable multivibrator including a first transistor having emitter, collector and base electrodes, said multivibrator being normally inoperative, means to trigger said multivibrator into operation, said first transistor upon said triggering going automatically from nonconduction to saturation back to nonconduction, a second transistor having emitter, collector and base electrodes, said base electrode of said second transistor being connected to ground, said emitter electrode of said second transistor serving as an output terminal for said saw-tooth waveform and also being connected to a voltage source by way of a variable resistor, said collector of said second transistor being connected to ground by way of a capacitor, unilateral means connecting said emitter of said first transistor to said collector of said second transistor, said unilateral means conducting current exclusively during said operative periods of said multivibrator thus charging said capacitor, means to discharge the current from said capacitor exclusively by way of said second transistor, means to control the current flow in said emitter of said second transistor, and output means from said emitter of said second transistor providing said saw-tooth waveform.

References Cited in the file of this patent

UNITED STATES PATENTS

| | | |
|---|---|---|
| 2,768,294 | Overbeek | Oct. 23, 1956 |
| 2,814,736 | Hamilton | Nov. 26, 1957 |
| 2,849,626 | Klapp | Aug. 26, 1958 |
| 2,898,481 | Gahwiler | Aug. 4, 1959 |
| 2,903,603 | Glenn | Sept. 8, 1959 |